United States Patent [19]

Hayashida et al.

[11] Patent Number: 5,028,955
[45] Date of Patent: Jul. 2, 1991

[54] EXPOSURE APPARATUS

[75] Inventors: Yasushi Hayashida, Yokoshima; Noriyuki Anai; Osamu Hirakawa, both of Kumamoto; Masami Akimoto, Kikuyo; Yasuhiro Sakamoto, Kumamoto; Keisuke Shigaki, Koshi; Masashi Moriyama, Tokorozawa, all of Japan

[73] Assignees: Tokyo Electron Limited, Tokyo; Tokyo Electron Kyushu Limited, Kumamoto, both of Japan

[21] Appl. No.: 480,005

[22] Filed: Feb. 14, 1990

[30] Foreign Application Priority Data

Feb. 16, 1989 [JP] Japan .................................. 1-39015

[51] Int. Cl.⁵ ...................... G03B 27/42; G03B 27/72
[52] U.S. Cl. ........................................ 355/53; 355/68
[58] Field of Search ................ 355/53, 68; 354/298, 354/72

[56] References Cited

U.S. PATENT DOCUMENTS

| | | | |
|---|---|---|---|
| 4,647,172 | 3/1987 | Batchelder et al. | 354/298 |
| 4,910,549 | 3/1990 | Sugita | 355/53 |

FOREIGN PATENT DOCUMENTS

| | | |
|---|---|---|
| 59-117123 | 7/1964 | Japan . |
| 53-37706 | 10/1978 | Japan . |
| 55-12750 | 1/1980 | Japan . |
| 58-58731 | 4/1983 | Japan . |
| 58-81932 | 6/1983 | Japan . |
| 58-159535 | 9/1983 | Japan . |
| 58-191434 | 11/1983 | Japan . |
| 58-200537 | 11/1983 | Japan . |
| 59-67930 | 5/1984 | Japan . |
| 60-94660 | 6/1985 | Japan . |
| 60-94661 | 6/1985 | Japan . |
| 60-110118 | 6/1985 | Japan . |
| 60-121719 | 6/1985 | Japan . |
| 60-189937 | 9/1985 | Japan . |
| 61-73330 | 4/1986 | Japan . |
| 61-121333 | 6/1986 | Japan . |
| 61-111151 | 7/1986 | Japan . |
| 61-184824 | 8/1986 | Japan . |
| 61-219135 | 9/1986 | Japan . |
| 61-239625 | 10/1986 | Japan . |
| 62-142321 | 6/1987 | Japan . |

*Primary Examiner*—L. T. Hix
*Assistant Examiner*—D. Rutledge
*Attorney, Agent, or Firm*—Oblon, Spivak, McClelland, Maier & Neustadt

[57] ABSTRACT

An exposure apparatus of this invention is used in an exposure process of semiconductor and LCD devices. The exposure apparatus includes a stage on which a semiconductor wafer is placed, a rotating mechanism for rotating the stage, a radiation unit arranged to oppose a support surface of the stage, a slider mechanism for reciprocating the radiation unit along a straight line passing through the center of the support surface of the stage, an exposure range input unit for inputting a desired exposure range of the wafer, an exposure range memory unit for storing the input exposure range, a CCD image sensor for detecting a reference position of the wafer, a relative position detector for detecting a relative position between the detected reference position and the radiation unit, a controller for controlling the sliding mechanism in correspondence with the relative position and the exposure range, and a light amount control mechanism for controlling an amount of light radiated from the irradiation mechanism to the wafer in correspondence with the relative position and the exposure range.

10 Claims, 9 Drawing Sheets

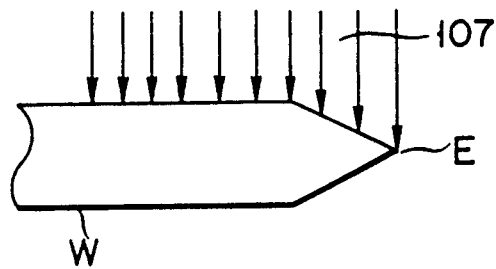
F I G. 6
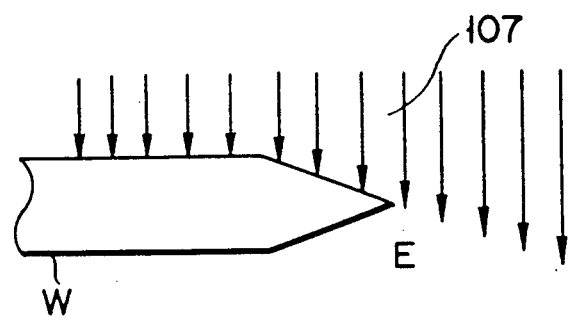
F I G. 7
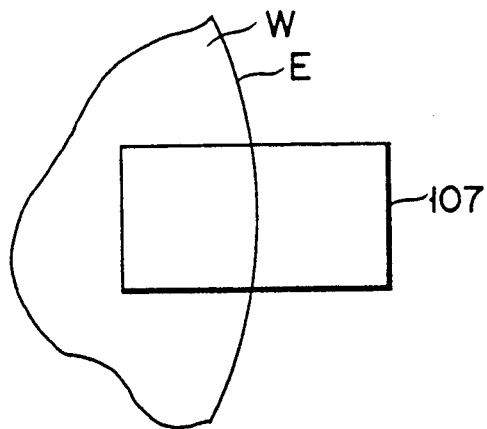
F I G. 8
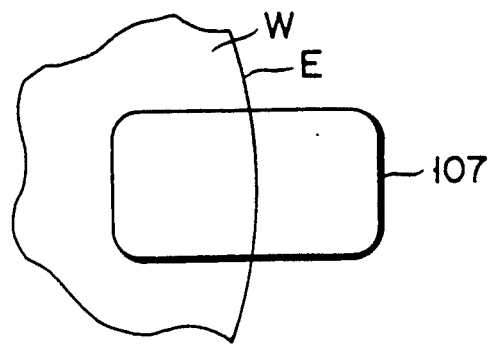
F I G. 9

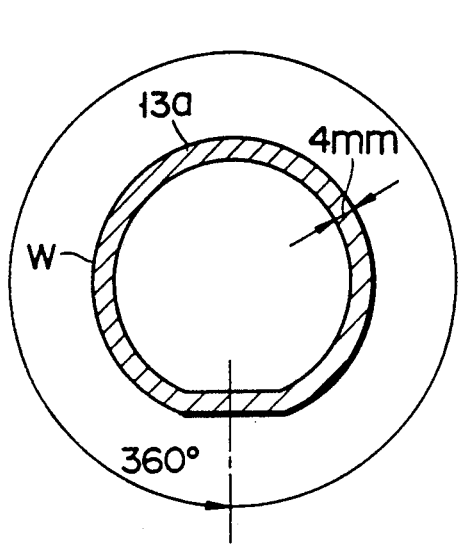
F I G. 10
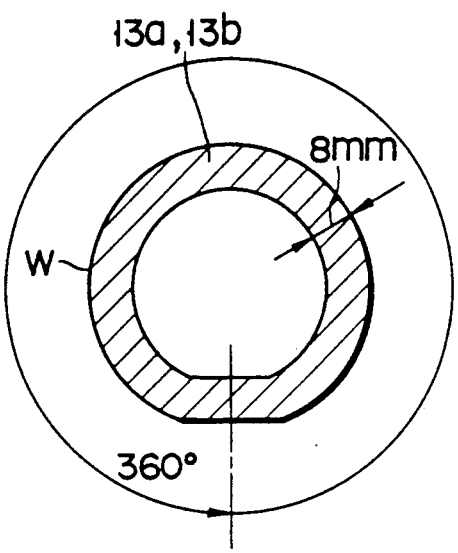
F I G. 11
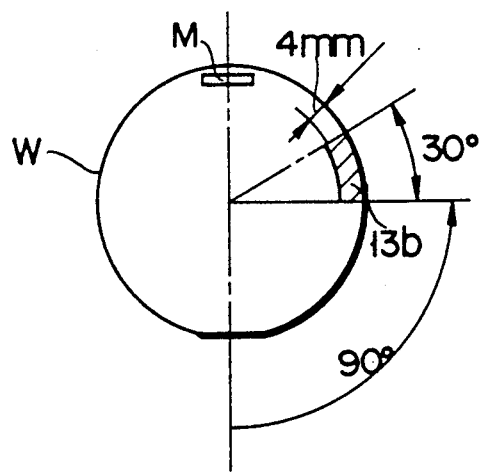
F I G. 12

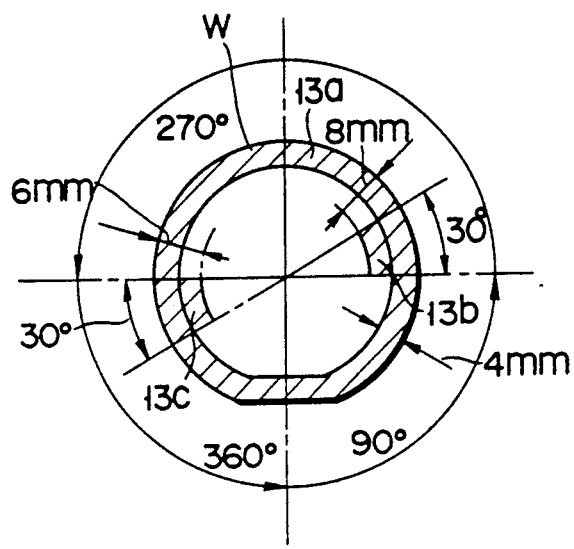 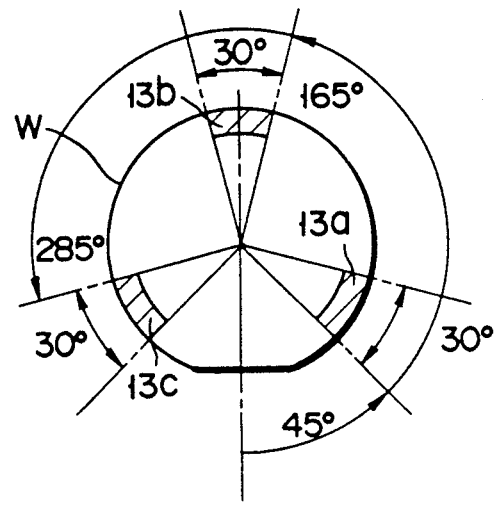
F I G. 13       F I G. 14
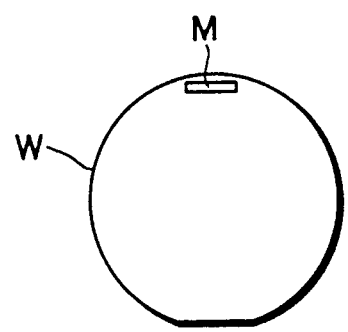
F I G. 15

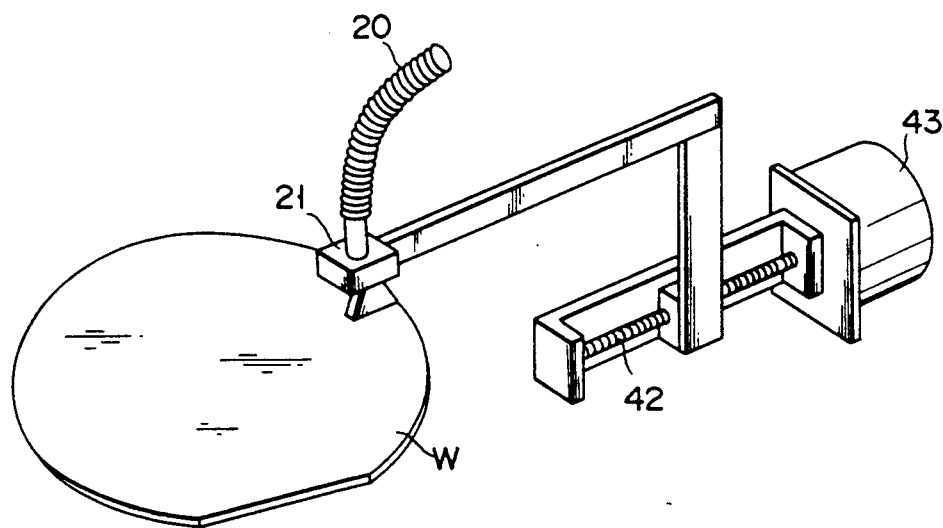
F I G. 16

EXPOSURE APPARATUS

BACKGROUND OF THE INVENTION

1. Field of the Invention

The present invention relates to an exposure apparatus used in a semiconductor fabrication process.

2. Description of the Related Art

In general, a lithographic process in semiconductor device fabrication includes five steps, i.e., a surface treatment step, a resist applying step, an exposure step, a developing step, and an etching step. Vacuum apparatuses such as a projection exposure apparatus and an etching apparatus are used to perform these steps. These vacuum apparatuses include mechanisms for clamping wafers by means of members. The wafers are transported by the mechanical structures or fixed on stages.

When a post-treatment of the resist applying step is insufficient, resist is left on an edge of each semiconductor wafer. In this case, when the wafer is clamped by the mechanism, the residual resist peels from the wafer upon contact between the resist and clamp members. The peeling resist becomes a foreign object such as dust, thus degrading the degree of cleanliness in the clean room.

Side rinse techniques are available as a means of preventing production of foreign objects (dust), as disclosed in Published Examined Japanese Patent Application No. 53-37706, Published Unexamined Japanese Patent Applications Nos. 55-12750, 58-58731, and 58-191434, Published Unexamined Utility Model Applications Nos. 60-94660 and 61-111151, and Published Unexamined Japanese Patent Applications Nos. 61-121333 and 61-184824.

Lower-surface washing techniques are also available as a means of preventing production of foreign objects (dust), as disclosed in Published Unexamined Japanese Patent Application No. 58-200537, Published Unexamined Utility Model Applications Nos. 58-81932 and 59-67930, and Published Unexamined Japanese Patent Applications Nos. 60-110118, 60-121719, 60-189937, and 61-239625.

In each conventional resist removal technique described above, resist is removed while a wafer is being rotated. For this reason, the resist tends to be left at a portion of an orientation flat (O.F.) of the wafer and may peel therefrom. When the resist removal range is so increased as to solve the above problem, the number of semiconductor devices per wafer is decreased, and consequently product yield also decreases. Even when another conventional apparatus is used wherein a resist projects upwards at the boundary of the resist removal area and a resist non-removal area, and a plurality of points outside the exposure area are used as focusing targets, the drawback of defocusing occurs at the point where the resist projects upwards.

Techniques for solving the above problem, which provide the O.F. with the same treatment as the curved edge are disclosed in Published Unexamined Japanese Patent Application Nos. 59-117123 and 61-219135. According to such a technique, a porous member containing a solvent is brought into contact with the wafer edge to remove the resist.

Even using this technique, however, problems such as defocusing during exposure are not solved.

For the purpose of eliminating the defocusing problem during exposure, exposure techniques for circularly eliminating the resist layer from the wafer edge are disclosed in Published Unexamined Japanese Patent Application Nos. 58-159535 and 61-73330, and Published Unexamined Utility Model Application No. 60-94661.

According to this technique, a semiconductor wafer is chucked by a chuck having a rotating shaft mounted with a cam having the same outline as that of the semiconductor wafer. An exposure light beam guided through an optical fiber is emitted along the edge of the cam while the wafer is being rotated, thereby exposing the edge portion of the wafer.

However, in the exposure apparatus having the cam described above, the cam must be replaced with another in accordance with types of wafers, resulting in inconvenience and preventing full-automation (FA) of the exposure step. In addition, the cam wears down, producing dust.

In the above exposure technique, in order to prevent the resist from peeling from wafer portions in contact with a mechanical arm during semiconductor wafer transportation, the resist is removed from these wafer contact portions in advance. According to this technique, since the resist is removed by exposing the entire edge portion of the wafer which includes the above wafer contact portions, the resist is excessively removed from the wafer edge portions which are not brought into contact with the mechanical arm.

In the above exposure technique, an ultraviolet ray is guided onto a wafer through an optical fiber and is moved across the wafer. Vibrations from the drive system are transmitted to the fiber, and a sharp exposure image cannot be obtained.

A read method using a CCD line sensor has a low throughput at present.

In addition, since the adjustment range of exposure amount per unit time is narrow, resist bubbles may be formed.

SUMMARY OF THE INVENTION

It is an object of the present invention to provide an exposure apparatus capable of preventing production of foreign objects such as dust and preventing defocusing during exposure.

It is another object of the present invention to provide an exposure apparatus capable of performing local exposure and exposing wafers at a high yield regardless of the shapes or size of the semiconductor wafers.

According to an aspect of the present invention, there is provided an exposure apparatus comprising: stage means on which an object is placed, said object being coated with a film for forming a device pattern; rotating means for rotating the stage means; radiating means for radiating a light on said object and arranged to oppose said object on the stage means; move means for moving the radiating means across an edge of the object on the stage means; exposure range input means for inputting a desired exposure range of the object; exposure range storage means for storing an information of input exposure range; reference position detecting means for detecting a reference position of the object; relative position detecting means for detecting a relative position between the detected reference position and the radiating means; control means for controlling the move means in correspondence with the relative position and the exposure range; and light amount control means for controlling an amount of light radiated from the radiating means to the object in correspondence with the relative position and the exposure range.

BRIEF DESCRIPTION OF THE DRAWINGS

FIGS. 6 and 7 are side views illustrating a peripheral edge of a semiconductor wafer so as to explain radiation states when viewed from the lateral direction;

FIGS. 8 and 9 are plan views illustrating the peripheral edge of the semiconductor wafer so as to explain radiation states when viewed from the top;

FIGS. 10 to 15 are plan views showing semiconductor wafers exposed under predetermined conditions, respectively;

FIG. 16 is a perspective view showing a main part of an exposure apparatus according to the second embodiment of the present invention.

DETAILED DESCRIPTION OF THE PREFERRED EMBODIMENTS

A few embodiments of the present invention will be described with reference to the accompanying drawings.

Figure 1:
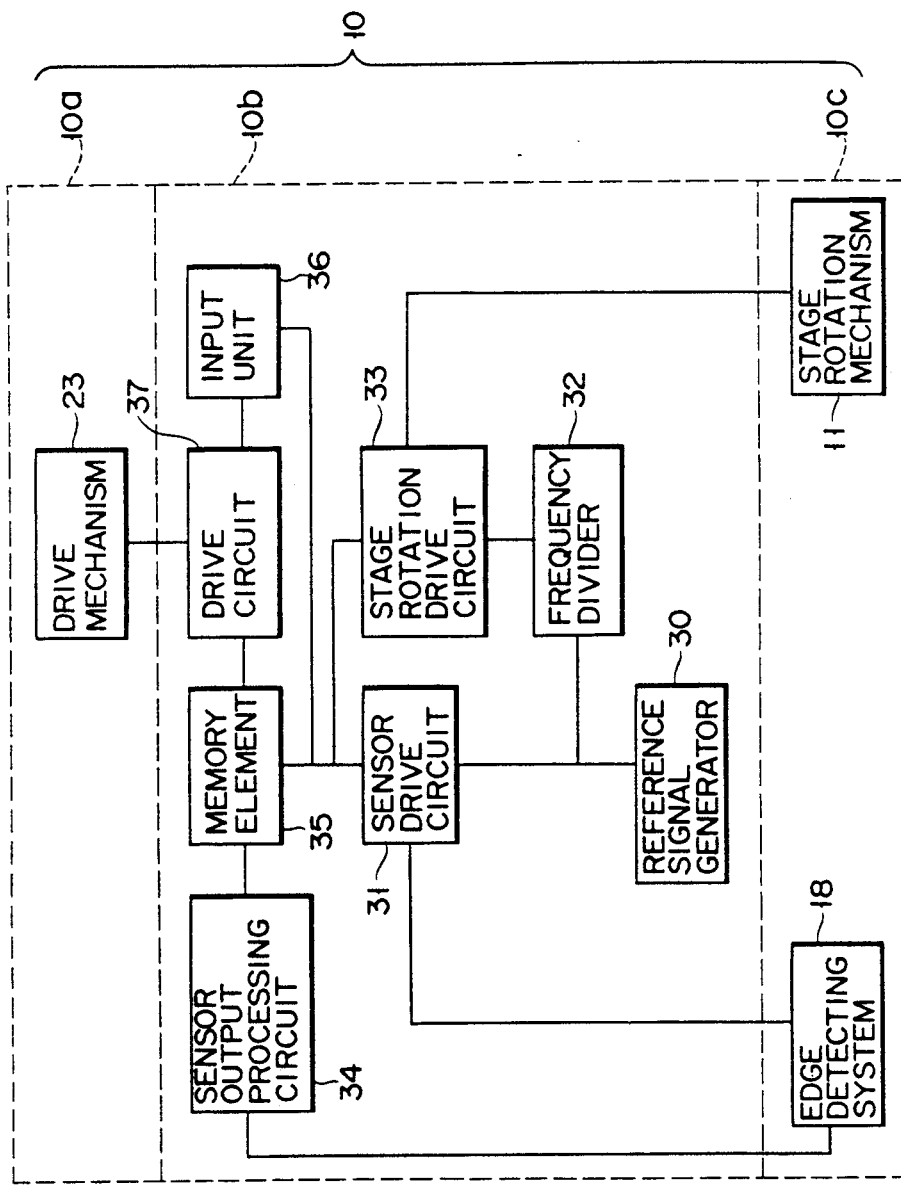
FIG. 1 is a block diagram of an exposure apparatus according to the present invention.
Figure 2:
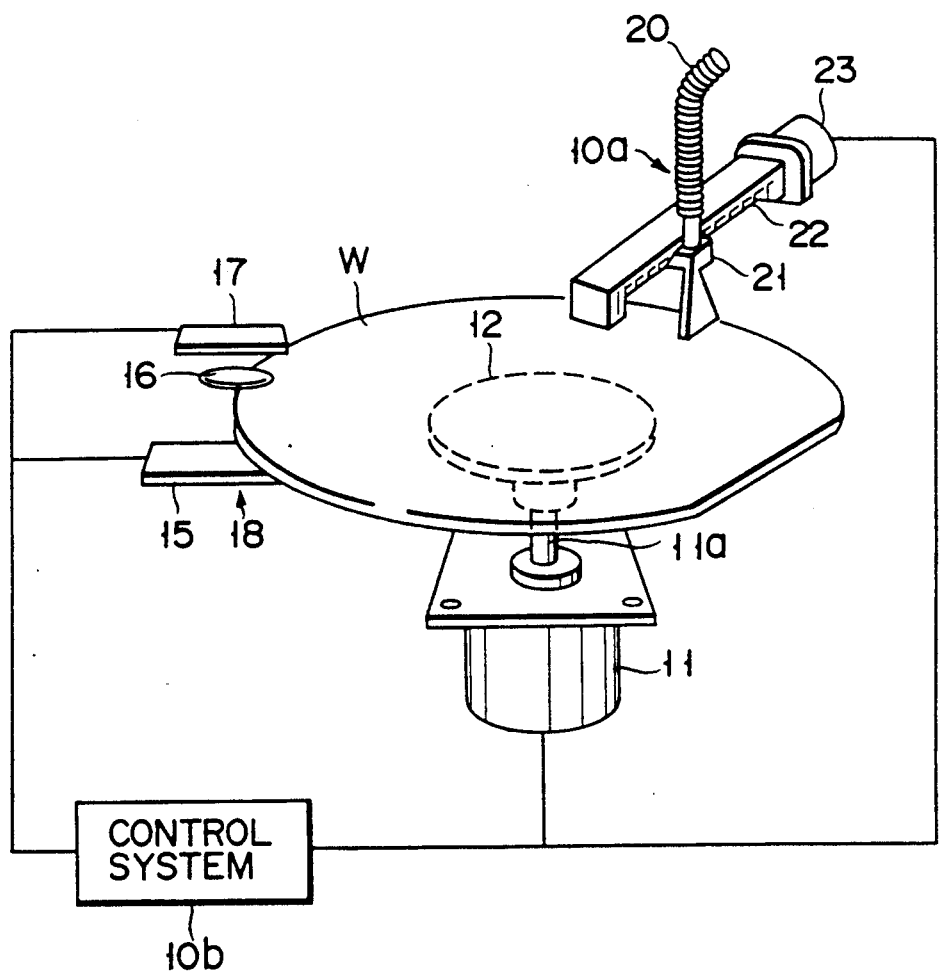
FIG. 2 is a perspective view showing a main part of an exposure apparatus according to the first embodiment of the present invention.

The first embodiment exemplifies a case wherein an exposure apparatus is used in side rinse and lower-surface washing. As shown in FIG. 1, a exposure apparatus 10 comprises an exposure system 10a, a control system 10b, and a stage system 10c. The exposure system 10a comprises a drive mechanism 23. As shown in FIG. 2, the drive mechanism 23 is used to move a slider mechanism 22 on a horizontal plane. A radiation unit 21 is mounted on the slider mechanism 22.

As shown in FIG. 1, the drive mechanism 23 is connected to a stage rotation mechanism 11 in the stage system 10c through a drive circuit 37, a memory unit 35, and a stage rotation drive circuit 33 in the control system 10b. The drive mechanism 23 is also connected to a photosensor (CCD image sensor) 17 in the stage system 10c through the drive circuit 37, the memory unit 35, and a sensor output processing circuit 34. In addition, a sensor drive circuit 31 connected to the memory element 35 and a reference signal generator 30 is connected to a drive mechanism (not shown) for driving a support member of the photosensor 17.

The sensor drive circuit 31 has a function of forming a drive pulse by using a clock signal generated by the reference signal generator 30. The stage rotation drive circuit 33 has a function of forming a drive pulse by using a pulse obtained by frequency-dividing the clock signal from the reference signal generator 30 by a frequency divider 32.

The sensor output processing circuit 34 compares an output signal level (a threshold value) with every pulse of scanning of the photosensor 17 and detects a peripheral edge (including an O.F. portion) of a wafer W.

As shown in FIG. 2, the stage rotation mechanism 11 has a stepping motor (not shown). This stepping motor is connected such that its angular position can be controlled with pulses in accordance with a command signal from the stage rotation drive circuit 33. The stage rotation mechanism 11 is connected to a stage 12 through a shaft 11a. The wafer W having an orientation flat is placed on the stage 12.

Figure 3:
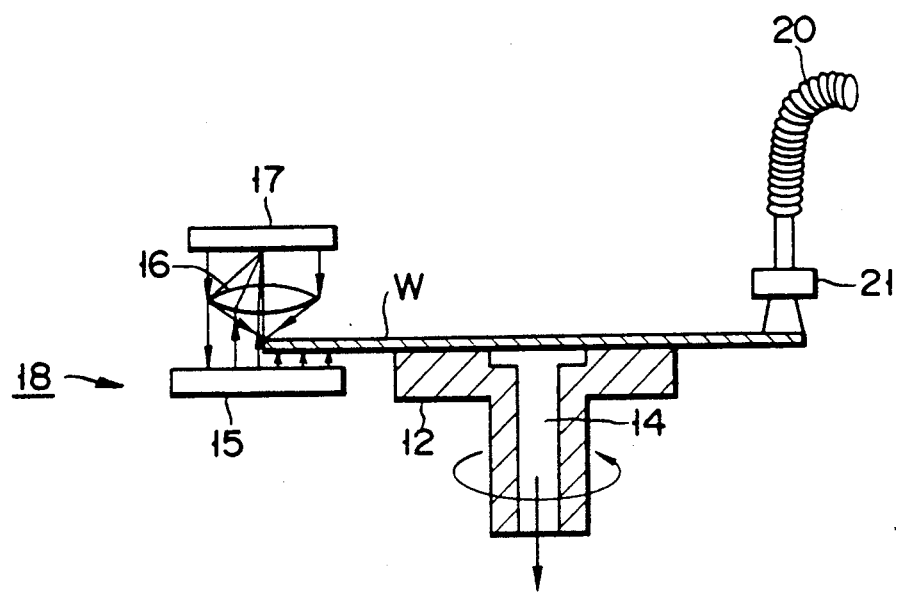
FIG. 3 is a longitudinal sectional view of a wafer stage of the exposure apparatus.

As shown in FIG. 3, the stage 12 has a hollow portion 14. The hollow portion 14 communicates with a suction port of a vacuum pump (not shown). An edge detecting system 18 is arranged near the peripheral edge of the wafer W on the stage 12. The edge detecting system 18 is used to detect an exposure reference position of the wafer W and has a back light 15, a lens 16, and said photosensor 17. The back light 15 opposes the lens 16 through the edge of the wafer W. The photosensor 17 is arranged above the lens 16.

The photosensor 17 comprises a one-dimensional sensor using a solid-state image pickup device such as a CCD (Charge-Coupled Device).

As shown in FIG. 2, the radiation unit 21 opposes the peripheral edge of the wafer W placed on the stage 12. The radiation unit 21 is guided near the peripheral edge of the wafer W by the slider mechanism 22. That is, when the slider mechanism 22 is slidably reciprocated by the drive mechanism 23, the radiation unit 21 extends above the upper area of the wafer W or is retracted therefrom.

Figure 4:
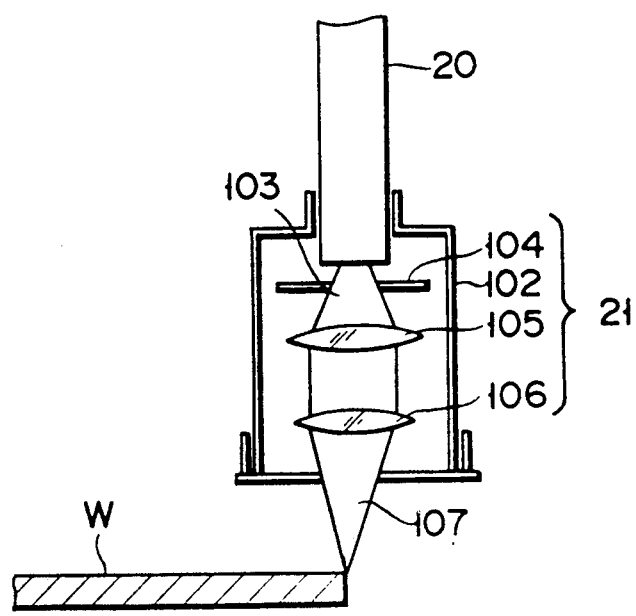
FIG. 4 is a view illustrating a radiation unit.
Figure 5:
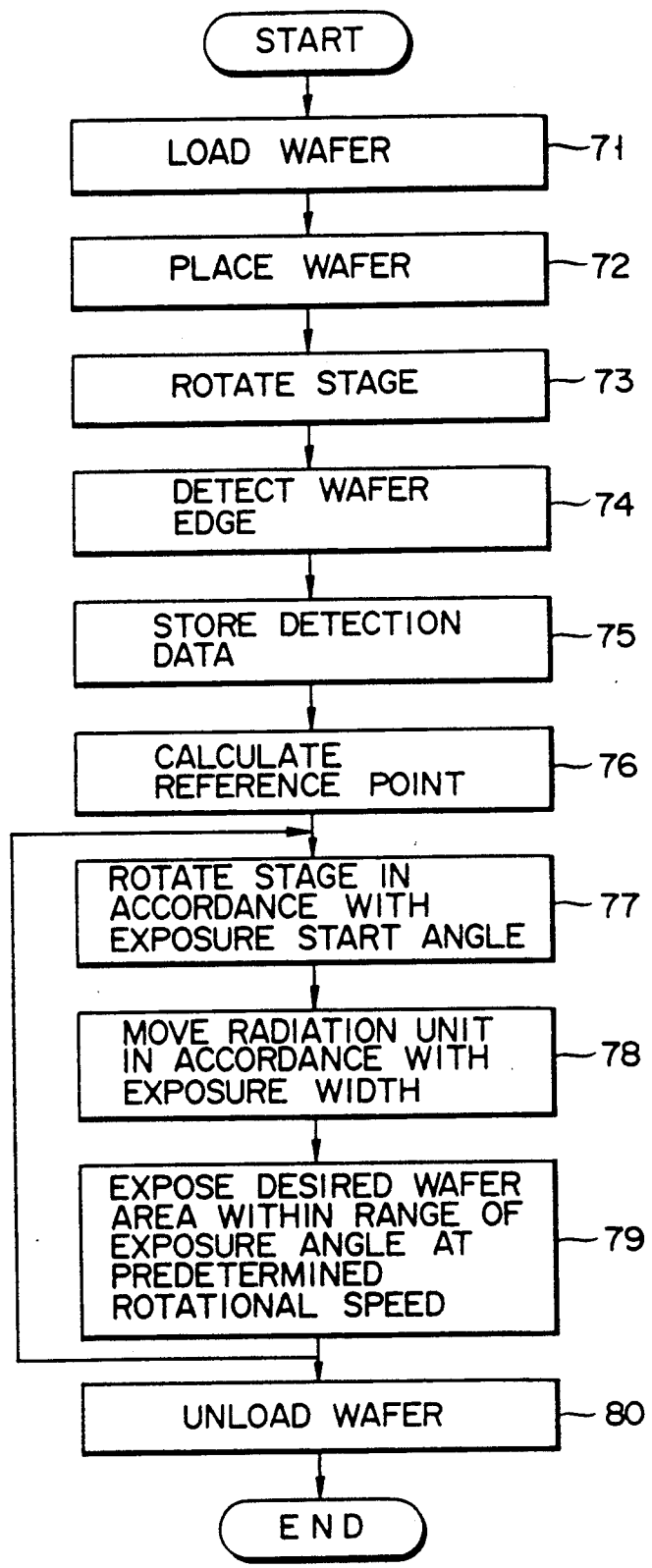
FIG. 5 is a flow chart showing an exposure step.

As shown in FIG. 4, the radiation unit 21 comprises an aperture 104 and first and second lenses 105 and 106. These components are stored in a housing 102. The distal end of a light guide tube 20 is connected to the housing 102 through an upper opening thereof. The light guide tube 20 is made of an optical fiber or a liquid fiber (trademark "ULTRA FINE TECHNOLOGY" available from Y Corp.) The proximal end of the light guide tube 20 is connected to a UV light source (not shown).

A UV beam guided into the housing 102 through the light guide tube 20 passes through an opening 103 of the aperture 104. The opening 103 has a square or rectangular shape. The first and second lenses 105 and 106 are arranged along the light path of the aperture 104, so that the UV beam is focused on the surface of the peripheral portion of the wafer W. In order to prevent a UV beam reflected by the wafer W from being incident on the radiation unit 21, a ring skirt 107 is attached to the lower portion of the radiation unit 21. Note that the inner wall of the housing 102 of the radiation unit 21 is preferably black.

The slider mechanism 22 has a ball screw (not shown). A driving force is transmitted from the drive mechanism 23 to the slider mechanism 22 through this ball screw. The drive mechanism 23 is driven by a stepping motor. Note that the exposure system 10a may be arranged at the position of the edge detecting system 18. When the exposure system 10a and the edge detecting system 18 are arranged at the same position, a throughput can be expected to be increased.

Operations of the edge detecting system 18 and the exposure system 10a are controlled by transmitting a command signal from the control system 10b to these components and sending back detection signals from these components to the control system 10b.

An exposure operation of the semiconductor wafer W by using the exposure apparatus described above will be described with reference to FIGS. 5 to 15 and Table 1.

(I) The recipe required for exposure of various types of semiconductor wafer W are input to an input unit 36. The recipe input depends on a key input at a keyboard or a two-dimensional data read operation by a two-dimensional sensor.

Recipe parameters include a "pass-through designation", a "lower illuminance limit", a "primary flat length", and a "sequence parameter".

"Pass-through designation" is a parameter which is used to designate the presence/absence of an exposure operation. For example, operations represented by serial Nos. 1 to 5 in Table 1 are conditions which do not require pass-through designation, and an operation represented by serial No. 6 in Table 1 is a condition which requires pass-through designation.

The "lower illuminance limit" represents a minimum illuminance required to start the exposure operation. The wafer W is not loaded until the actual illuminance of the radiation unit 21 exceeds the lower limit. For example, assume that the illuminance range is set to be 0 to 9,900 mW, and the illuminance unit is 100 mW. Under these conditions, the lower illuminance values in the operations represented by serial Nos. 1 to 5 are set to be 1,000 mW each. No lower illuminance limit need be set for the operation represented by serial No. 6.

The "primary flat length" represents a length of the O.F. portion of the wafer W. The central point of the O.F. portion is detected as a reference position on the basis of the fat length. For example, assume the range of length is set to be 10 to 150 mm, and the unit of length is 1 mm. Under these conditions, the primary flat lengths in the exposure operations represented by serial Nos. 1 to 6 in Table 1 are set to be 55 mm each. Note that the primary flat length need not be set when an exposure operation is performed by one revolution (i.e., an exposure operation in a 360° exposure range around central point of the wafer W).

The "sequence parameter" will be described below.

The "sequence parameter" is used to set an exposure area. A combination of parameters, i.e., "exposure start orientation", "degree of exposure range", "exposure width", and "exposure time per revolution" shown in the columns of Table 1 constitute a sequence unit, and a plurality of sequences can be set by a single exposure cycle.

The "exposure start orientation" sets a counterclockwise angle (see FIGS. 10 to 14) with respect to the central point of the O.F. portion as a reference position. The exposure start orientation can fall within the range of 0 to 359°, and the unit of angle is 1°. This parameter is not set in the exposure operation by one revolution.

The "degree of exposure range" is defined as an angle between the exposure start orientation and an exposure end angle. The degree of exposure range falls within the range of 0° to 360°, and the unit of the degree of exposure range is 1°. When the degree of exposure range is set to be 360°, the exposure operation is determined be an exposure operation by one revolution. In this case, the exposure start orientation is neglected.

The "exposure width" is used to set a position to be exposed from the edge of the wafer W to the center thereof. A maximum exposure width falls within the range of 0 to 35.0 mm, and the unit of width is 0.1 mm.

The "exposure time per revolution" is used to set a time corresponding to the rotational speed of the wafer W during exposure. The set time is a period during which the wafer W is rotated once. For example, when the exposure time per revolution is set to be 20 seconds at 180° of the exposure range, the 180° range of the wafer W is exposed by only 10 seconds ($=20\times 180/360$).

(II) When a predetermined recipe is input to the input unit 36, the switch of the exposure apparatus 10 is turned on to start exposure. The semiconductor wafer W is loaded into the stage system 10c by a handling mechanism (not shown) (STEP 71), and the wafer W is positioned and placed on the stage 12 (STEP 72).

A resist having a predetermined thickness is applied to the surface of the wafer W. When the wafer W is placed on the stage 12, the wafer W is fixed on the stage 12 by vacuum suction.

(III) The exposure system 10a and the stage system 10c are sequence-controlled on the basis of command signals from the control system 10b. That is, signals are supplied from the circuit 33 to the mechanism 11 to rotate the stage 12 at a speed of 1 to 6 rpm (STEP 73).

(IV) The photosensor 17 of the edge detecting system 18 is scanned every step of the stepping motor of the mechanism 11. The position of the edge of the wafer is detected by this scanning (STEP 74).

An output signal from the photosensor 17 is obtained as a voltage level difference proportional to the position spaced apart from the edge of the wafer W. A distance from the edge of the wafer W to the exposure area is calculated by the circuit 34 on the basis of the output signal from the photosensor 17. In this case, the contrast level of the output signal from the photosensor 17 is increased by radiation light from the back light 15. The back light 15 may comprise a one-dimensional LCD or a surface light source. When the sensitivity level of the photosensor 17 is sufficiently high, the back light 15 need not be used.

The lens 16 is arranged to assure the width detected by the photosensor 17. For this reason, when a size difference between the wafers W to be processed is not so large, the lens 16 need not be used.

The photosensor 17 preferably comprises a CCD image sensor as a solid-state image pickup device because the CCD image sensor has a high sensitivity even for an object such as glass having a high transmittance and can detect a very small light amount difference.

When exposure by one revolution is to be performed, detection for the second half revolution can be performed simultaneously with detection for the first half revolution after the detection for the first half revolution is performed, thereby shortening the processing time.

(V) Detection data of the edge position of the wafer W is stored in the memory unit 35 in the control system 10b (STEP 75). An exposure width and the central point (reference of the edge of the O.F. portion which are required for side rinse and lower-surface washing are calculated on the basis of the stored data and the predetermined recipe (STEP 76).

The radiation position of the exposure system 10a is controlled on the basis of the calculation result. That is, the radiation unit 21 radiates a light beam from a light source (not shown) guided through the light guide tube 20. The exposure light source comprises, e.g., a mercury or xenon lamp.

The radiation position of the exposure beam is determined on the basis of the data stored in the memory unit 35. A signal calculated to represent a desired area to be exposed is supplied from the memory unit 35 to the circuit 37 to perform side rinse or lower-surface washing of the wafer W. The slider mechanism 22 and the drive mechanism 23 are controlled on the basis of this signal (to be described later).

(VI) The stage 12 is rotated through only a predetermined angle and is stopped at a position where the wafer W is directed to an exposure start direction with respect to the radiation unit 21 (STEP 77).

The radiation unit 21 is then moved to a predetermined position in accordance with an exposure width (STEP 78)

A light beam having a predetermined amount is radiated from the radiation unit 21 while the stage 12 is kept rotated at a predetermined speed (STEP 79), thereby exposing a desired area of the wafer W. In this case, a shutter may be formed in the light path from the radiation unit 21 to adjust the amount of radiation light. For example, the wafer W is continuously exposed every step of the stepping motor while being fixed on the stage 12. Therefore, the exposure operation for the O.F. portion of the wafer W and a portion whose exposure angle is designated can be performed in the same manner as in other wafer portions.

When multiple exposure is to be performed, the flow returns from STEP 79 to STEP 77, and operations in STEP 77 to STEP 79 are repeated.

With reference to FIGS. 6 to 9, radiation states of exposure light on the edge portions of the wafer W will be described in detail.

An input light beam 103 is focused by the aperture 104 of the radiation unit 21 to have a rectangular spot.

As shown in FIG. 6, the light beam 107 may be radiated on only the edge of the wafer W. However, preferably, as shown in FIG. 7, the light beam 107 is radiated such that an edge E of the wafer W crosses the beam. Note that an edge E of the wafer W is illustrated to have a triangular section in FIGS. 6 and 7 so as to emphasize the edge E.

As shown in FIG. 8, the light beam 107 may have a rectangular spot. However, preferably, as shown in FIG. 9, corners of the rectangle are smoothed. In addition, the light beam 107 may have an elliptical spot because when an angle at the corner portion of the irradiated region is small, the illuminance at each corner is decreased and uniform peripheral exposure is undesirably interfered.

(VII) When a desired exposure operation is completed up to STEP 79, the wafer W is unloaded from the exposure apparatus 10 by a handling mechanism (not shown) (STEP 80). After unloading, the wafer W is developed and washed, and the resist film is partially removed to obtain a predetermined pattern.

Exposure operations performed by variously changing conditions of the wafer W will be described with reference to FIGS. 10 to 15 and Table 1.

TABLE 1

| Serial No. | Sequence No. | Exposure Start Orientation | Degree of Exposure Range | Exposure width (mm) | Exposure time per round (sec) |
|---|---|---|---|---|---|
| 1 (see FIG. 10) | 1 | 0° | 360° | 4.0 | 20 |
| 2 (see FIG. 11) | 1 | 0° | 360° | 4.0 | 20 |
|  | 2 | 0° | 360° | 8.0 | 20 |
| 3 (see FIG. 12) | 1 | 90° | 30° | 4.0 | 20 |
| 4 (see | 1 | 0° | 360° | 4.0 | 20 |
|  | 2 | 90° | 30° | 8.0 | 20 |
| FIG. 13) | 3 | 270° | 30° | 6.0 | 20 |
| 5 (see FIG. 14) | 1 | 45° | 30° | 4.0 | 20 |
|  | 2 | 165° | 30° | 4.0 | 20 |
|  | 3 | 285° | 30° | 4.0 | 20 |
| 6 (see FIG. 15) | — | — | — | — | — |

As shown in FIG. 10, a wafer W is exposed under conditions corresponding to serial No. 1 in Table 1. A hatched portion 13a in FIG. 10 represents an exposure area obtained by exposing an edge portion of the wafer W with a width of 4 mm by 360°.

As shown in FIG. 11, a wafer W is exposed under conditions corresponding to serial No. 2 in Table 1. Hatched portions 13a and 13b in FIG. 11 represent exposure areas obtained by multiple-exposing edge portions of the wafer W with widths of 4 mm and 8 mm by 360°.

As shown in FIG. 12, a wafer W is exposed under the conditions corresponding to serial No. 3 in Table 1. A hatched portion 13a in FIG. 12 represents an exposure area obtained by partially exposing an edge portion of the wafer W wit width of 4 mm by 30° by selecting 90° as an exposure start orientation.

As shown in FIG. 13, a wafer W is exposed under the conditions corresponding to serial No. 4 in Table 1. A hatched portion 13a in FIG. 13 represents an exposure area obtained by exposing an edge portion of the wafer W with a width of 4 mm by 360°, a hatched portion 13b represents an exposure area obtained by partially exposing an edge portion of the wafer W with a width of 8 mm by 30°, an hatched portion 13c represents an exposure area obtained by partially exposing an edge portion of the wafer W with a width of 6 mm by 30°.

As shown in FIG. 14, a wafer W is exposed under the conditions corresponding to serial No. 5 in Table 1. Hatched portions 13a, 13b, and 13c represent exposure areas obtained exposing edge portions of the wafer W with a width of 4 m each by 30°.

As shown in FIG. 15, a wafer W is obtained under the conditions corresponding to serial No. 6 in Table 1, i.e., is not exposed by pass-through designation.

When the wafers W shown in FIGS. 10 to 14 were developed and washed, local projections of the resist films were not found. For this reason, defocusing can be prevented, and the semiconductor wafer W can be clearly micropatterned with ease.

In place of the central point of the O.F. portion, each identification mark M shown in FIGS. 12 and 15 may be utilized to select the central point of the identification mark as reference points to set exposure areas.

In the above embodiment, the CCD image sensor is employed as the photosensor 17 in the edge detecting system 18. However, any sensor can be used if it can detect an edge a wafer W in a non-contact manner.

In the above embodiment, the ball screw is used in the slider mechanism 22. However, the present invention is not limited to this. For example, a slider mechanism having a timing belt, a linear motor, and the like may be employed.

In addition, as shown in FIG. 16, a slider mechanism 42 and a drive mechanism 43 may be arranged at positions lower than the wafer W. With this arrangement, dust produced from the mechanisms 42 and 43 can hardly be attached to the wafer W. The degree of cleanliness of the apparatus as a whole can be increased.

An exposure apparatus according to the third embodiment of the invention will be described, with reference to FIG. 17. In the apparatus of this embodiment, the amount of exposure is adjusted on the basis of detection results obtained by a position detecting mechanism, so as to control the amount of exposure in accordance with region of a wafer W.

Figure 17:
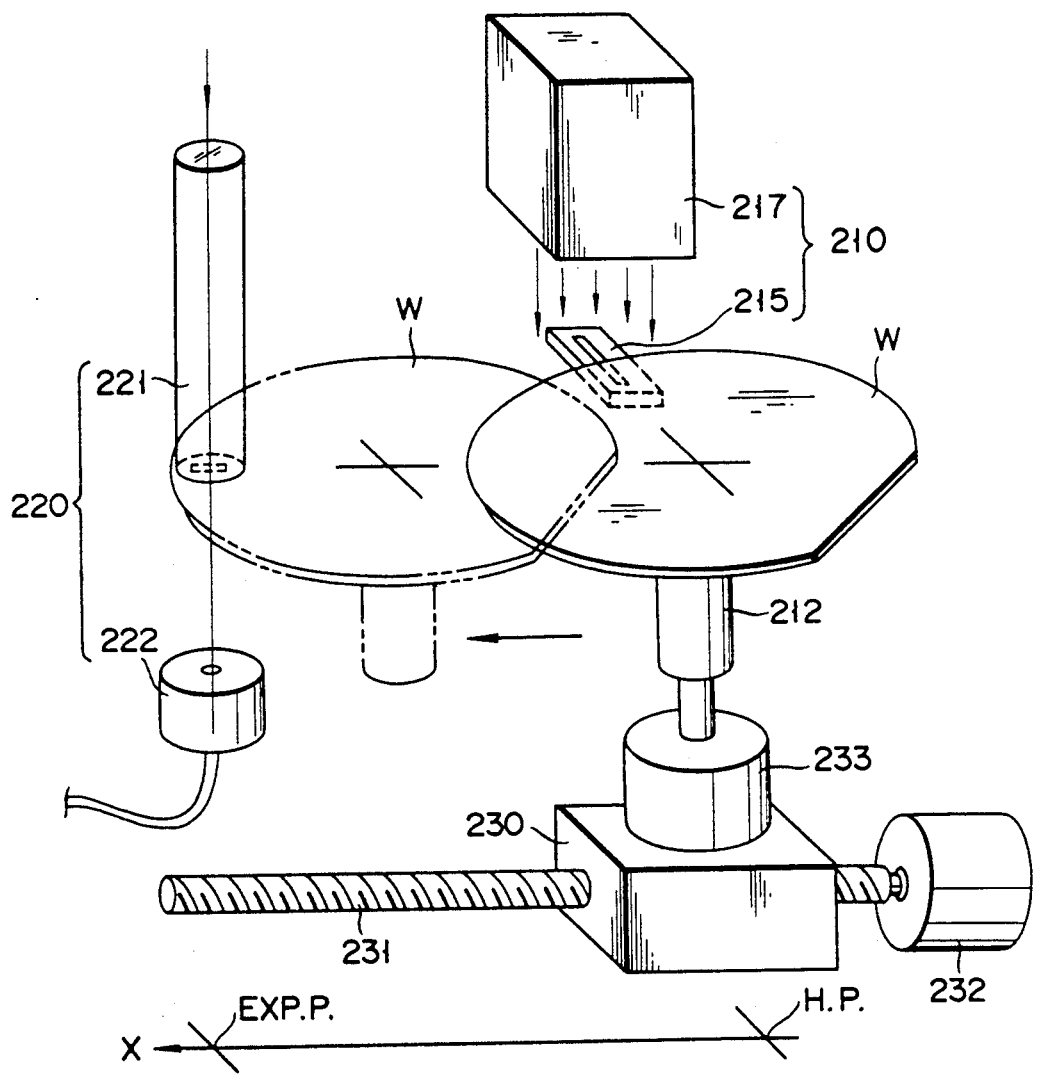
FIG. 17 is a perspective view showing a main part of an exposure apparatus according to the third embodiment of the present invention (estimation exposure).

Referring to FIG. 17, the lower portion of a wafer stage 212 is coupled to the shaft of a θ-motor 233. This θ-motor 233 is attached to the upper face of a movable case 230. The movable case 230 has a ball nut (not shown) with which a ball screw 231 is threadably engaged. The ball screw 231 extends in the X-axis direction and is connected at one end to the shaft of an X-motor 232.

When the movable case 230 is located at the home position H.P., a CCD line sensor 210 faces a peripheral edge portion of a wafer W placed on the stage 212. The CCD line sensor 210 includes a CCD light source 217 and a CCD 215. The CCD light source 217 is located above the wafer W, while the CCD 215 is located under the wafer W. The CCD light source 217 incorporates a rod lens (not shown) and emits parallel light rays toward the CCD 215.

An exposure system 220 is arranged at an exposure position EXP.P., which is away from the CCD line sensor 210 by a predetermined distance. The exposure system 220 includes an illumination nozzle 221 and an illuminance measuring device 222. The illumination nozzle 221 and the illuminance measuring device 222 are arranged with their optical axes aligned with each other. The illumination nozzle 221 is located above the wafer W, while the illuminance measuring device 222 is located under the wafer W. The upper end of the illumination nozzle 221 is optically connected to a UV light source (not shown).

The CCD line sensor 210 and the exposure system 220 are connected to predetermined circuit portions incorporated in a control system.

A description will be given as to how a wafer W is exposed to light by use of the exposure apparatus of the third embodiment.

First, the movable case 230 is moved to the home position H.P., and the wafer W is transferred into the interior of the exposure apparatus by a transferring mechanism (not shown) and is then mounted on the stage 212.

Next, at the home position H.P., the stage 212 is rotated, and the position and central position of the O.F. of the wafer are detected by the CCD line sensor 210. The information obtained by this detection is stored in a memory unit of the control system.

Thereafter, the movable case 230 is moved from the home position H.P. to the exposure position EXP.P.

The wafer is irradiated with a UV light, while simultaneously controlling the rotating speed of the stage 212 on the basis of the information. For example, when the stage 212 is rotated fast, the amount of light to which the wafer W is exposed per unit time is reduced.

With the rotating speed of the sage 212 controlled, the amount of light which the wafer W is exposed can be adjusted in a desirable range. Since the wafer W is prevented from being irradiated with an excessive amount of light, resist is kept from foaming, and the throughput can be improved.

In addition, estimated exposure can be performed by controlling the time for which the wafer W is exposed to light.

Moreover, the above-mentioned detection information can be used not only for controlling the moving distance and moving speed of the wafer W (in the X-axis direction) but also for controlling the angle and speed of rotation of the wafer W. Accordingly, any portion of the wafer W (e.g., the periphery, the O.F. portion thereof, etc.) can be selectively exposed to light.

In the above embodiment, the object to be exposed is a semiconductor wafer. However, the object to be exposed is not limited to this, but can be extended to a rectangular glass substrate with a film for a liquid crystal display (LCD) or the like.

In the above embodiment, the upper surface of a semiconductor wafer is treated. However, the lower surface may also be treated if this treatment is limited to its edge.

In the above embodiment, the edge of a semiconductor wafer is exposed while a rotating shaft is fixed. However, the position of the rotating shaft may be adjusted on the basis of the data of the wafer edge portion.

In the above embodiment, the illuminance of exposure light is constant. However, the present invention can cope with light whose illuminance is lower than that in the initial operating state. This is so-called integrated exposure, which can be achieved by a control system having a function of compensating for a decrease in illuminance by prolonging the exposure time.

The effects of the present invention will be summarized as follows.

In the exposure apparatus of the present invention, production of foreign objects except for a resist can be prevented. In addition, defocusing can be prevented.

Only a desired portion of a target substrate can be selectively and partially exposed. Furthermore, exposure can be achieved at a high yield regardless of the shapes of the target substrates.

Since the apparatus of the present invention has the various effects described above, reliability of the overall exposure process can be improved, and a throughput can be increased.

What is claimed is:

1. An exposure apparatus comprising:
   stage means on which an object is placed, said object being coated with a film for forming a device pattern;
   rotating means for rotating said stage means;
   radiating means for radiating a light on said object and arranged to oppose said object on said stage means;
   move means for moving said radiating means across a peripheral edge of the object on the stage means;
   exposure range input means for inputting a desired exposure range of the object;
   exposure range storage means for storing an information of input exposure range;
   position detecting means for detecting a position of said radiating means and a reference position of the object;
   positional relationship obtaining means for obtaining a positional relationship between the detected position of the radiating means and the reference position;

control means for controlling said move means in correspondence with the positional relationship and the exposure range read out from said exposure range storage means; and light amount control means for controlling an amount of light radiated from said radiating means to the object in correspondence with the positional relationship and the exposure range.

2. The apparatus according to claim 1, wherein said exposure range input means comprises a two-dimensional sensor for detecting a two-dimensional data.

3. The apparatus according to claim 1, wherein said position detecting means comprises a CCD image sensor.

4. The apparatus according to claim 3, wherein said position detecting means comprises a back light for contrasting a signal from the sensor.

5. The apparatus according to claim 1, wherein said light amount control means selectively controls the desired exposure range.

6. The apparatus according to claim 1, wherein said radiating means comprises an optical fiber.

7. The apparatus according to claim 1, wherein said radiating means comprises two lenses.

8. The apparatus according to claim 1, wherein said radiating means comprises an aperture.

9. The apparatus according to claim 1, wherein said rotating means comprises a stepping motor so that said radiating means is synchronized with said rotating means.

10. The apparatus according to claim 1, wherein said radiating means is mounted on a stationary member.

* * * * *